(12) United States Patent
Kim et al.

(10) Patent No.: US 9,984,950 B2
(45) Date of Patent: May 29, 2018

(54) SEMICONDUCTOR PACKAGE AND METHOD FOR MANUFACTURING THE SAME

(71) Applicant: KOREA ELECTRONICS TECHNOLOGY INSTITUTE, Seongnam-si, Gyeonggi-do (KR)

(72) Inventors: Jun Chul Kim, Seongnam-si (KR); Dong Su Kim, Seongnam-si (KR); Jong Min Yook, Busan Seongnam-si (KR)

(73) Assignee: KOREA ELECTRONICS TECHNOLOGY INSTITUTE, Seongnam-si, Gyeonggi-do (KR)

( * ) Notice: Subject to any disclaimer, the term of this patent is extended or adjusted under 35 U.S.C. 154(b) by 0 days. days.

(21) Appl. No.: 15/441,188

(22) Filed: Feb. 23, 2017

(65) Prior Publication Data
US 2017/0309541 A1    Oct. 26, 2017

(30) Foreign Application Priority Data
Apr. 20, 2016    (KR) .......................... 10-2016-0048300

(51) Int. Cl.
| | |
|---|---|
| *H01L 23/52* | (2006.01) |
| *H01L 23/367* | (2006.01) |
| *H01L 23/14* | (2006.01) |
| *H01L 23/13* | (2006.01) |
| *H01L 23/373* | (2006.01) |
| *H01L 23/485* | (2006.01) |
| *H01L 21/52* | (2006.01) |
| *H01L 21/56* | (2006.01) |

(52) U.S. Cl.
CPC .......... *H01L 23/3675* (2013.01); *H01L 21/52* (2013.01); *H01L 21/56* (2013.01); *H01L 23/13* (2013.01); *H01L 23/142* (2013.01); *H01L 23/3735* (2013.01); *H01L 23/3736* (2013.01); *H01L 23/485* (2013.01)

(58) Field of Classification Search
CPC ............... H01L 23/142; H01L 23/3675; H01L 23/3736; H01L 23/485; H01L 23/13; H01L 21/52; H01L 21/56
See application file for complete search history.

(56) References Cited

U.S. PATENT DOCUMENTS

| | | | | |
|---|---|---|---|---|
| 5,629,835 A | * | 5/1997 | Mahulikar | ............... H01L 23/24 174/252 |
| 2009/0194869 A1 | * | 8/2009 | Eom | ..................... H01L 23/367 257/712 |
| 2016/0197063 A1 | * | 7/2016 | Lin | ......................... H01L 24/97 257/686 |

FOREIGN PATENT DOCUMENTS

KR    10-1013-0140354 A    12/2013

* cited by examiner

*Primary Examiner* — Syed Gheyas
(74) *Attorney, Agent, or Firm* — Hauptman Ham, LLP

(57) ABSTRACT

Disclosed is a semiconductor package including: a base substrate provided with at least one cavity and made of a metallic material; at least one semiconductor chip mounted in the cavity; and a heat dissipating member arranged in a gap between an inner surface of the cavity and the semiconductor chip.

9 Claims, 14 Drawing Sheets

SEMICONDUCTOR PACKAGE AND METHOD FOR MANUFACTURING THE SAME

CROSS REFERENCE TO RELATED APPLICATION

The present application claims priority to Korean Patent Application No. 10-2016-0048300, filed Apr. 20, 2016, the entire contents of which is incorporated herein for all purposes by this reference.

BACKGROUND OF THE INVENTION

1. Field of the Invention

The present invention relates to a semiconductor package and a method for manufacturing the same.

2. Description of the Related Art

In operation of a semiconductor device, charges move along a current path and, at this time, heat is generated due to resistance in the current path. This heat deteriorates performance and shortens lifespan of the semiconductor device. Particularly, in a power semiconductor device operating at high voltage and current, heat that is generated during operation thereof causes problems such as thermal runaway, resulting in deterioration in performance of the power semiconductor device and furthermore breakdown of the power semiconductor device.

Accordingly, studies and research for reduction and dissipation of heat generated from a semiconductor chip are urgently required. One method for heat dissipation is to attach a heat sink to the back surface of a semiconductor chip. Specifically, development has been made to diversify shapes of a heat sink and to increase thermal conductivity of a material used to attach a heat sink to a semiconductor chip.

DOCUMENT OF RELATED ART

Patent Document (Patent Document 1) Korean Patent Application Publication No. 10-2013-0140354

SUMMARY OF THE INVENTION

Accordingly, the present invention has been made keeping in mind the above problems occurring in the related art, and an object of the present invention is to provide a semiconductor package having high heat dissipation efficiency, the semiconductor package having a structure in which a semiconductor chip is mounted on a base substrate made of a metallic material that is electrically conductive and has high thermal conductivity, and a heat dissipating member made of a metallic material that is electrically conductive and has high thermal conductivity is arranged between the base substrate and the semiconductor chip.

In order to accomplish the object of the present invention, according to one aspect, there is provided a semiconductor package including: a base substrate provided with at least one cavity and made of a metallic material; at least one semiconductor chip mounted in the cavity; and a heat dissipating member arranged in a gap between an inner surface of the cavity and the semiconductor chip.

In addition, a back surface and side surfaces of the semiconductor chip may be covered by the heat dissipating member, and a back surface of the base substrate may be covered by the heat dissipating member.

In addition, the semiconductor package may further include at least one electrode pattern formed on a front surface of the base substrate and electrically connected to the base substrate.

In addition, the semiconductor package may further include at least one trench extending through the base substrate and the heat dissipating member in a thickness direction thereof, thereby dividing the base substrate and the heat dissipating member into a ground portion and an electrode portion and electrically insulating the ground portion and the electrode portion from each other.

In addition, the ground portion may include a first base substrate within which the semiconductor chip is mounted and a first heat dissipating member covering the back surface of the first base substrate, and the electrode portion may include a second base substrate electrically insulated from the first base substrate and a heat dissipating member covering the back surface of the second base substrate.

In addition, the trench may include a first portion extending in a first direction of a surface of the base substrate and having a predetermined length and a second portion extending from an end of the first portion in a second direction different from the first direction and having a predetermined length.

In addition, the electrode portion may be formed near an edge of the base substrate and the electrode portion and an electrode pad of the semiconductor chip may be formed in one-on-one correspondence.

In addition, the trench may be formed such that the first portion extends in a widthwise direction of the base substrate and having the predetermined length and the second portion extends from the end of the first portion in a lengthwise direction of the base substrate and having the predetermined length, separating the electrode portion from the ground portion by a predetermined distance.

In order to accomplish the objects of the present invention, according to another aspect, there is provided a method for manufacturing a semiconductor package, the method including: forming at least one cavity in a base substrate made of a metallic material; mounting a semiconductor chip in the cavity; and forming a heat dissipating member to fill a gap between an inner surface of the cavity and the semiconductor chip and to cover a back surface of the base substrate.

In addition, the method may further include: forming an insulation layer on a front surface of the base substrate after the forming of the heat dissipating member; and forming an electrode pattern electrically connected to the semiconductor chip and an electrode pattern electrically connected to a portion of the base substrate, on the insulation layer.

In addition, the method further include dividing the base substrate and the heat dissipating member into a ground portion within which the semiconductor is mounted and an electrode portion electrically insulated to and located on one side of the ground portion.

In addition, the dividing of the base substrate and the heat dissipating member may include: forming at least one trench at a boundary portion between the ground portion and the electrode portion, thereby separating the ground portion from the electrode portion by a predetermined distance, the trench extending through the base substrate and the heat dissipating member in a thickness direction and being elongated in a longitudinal direction and a widthwise direction of the base substrate when shown in a plan view of the base substrate; filling the trench with an insulation material and forming an insulation layer on the front surface of the base substrate; forming an electrode pattern that electrically connects an electrode pad of the semiconductor chip to the electrode portion; and cutting the base substrate and the heat dissipating member along dicing lines extending at positions near respective ends of the trench, thereby electrically insulating the ground portion and the electrode portion from each other.

The present invention provides a semiconductor package having a structure in which a semiconductor chip is mounted on a base substrate made of a metallic material that is electrically conductive and has high thermal conductivity, and a heat dissipating member made of a metallic material that is electrically conductive and has high thermal conductivity is arranged between the base substrate and the semiconductor chip. Therefore, the semiconductor package can dissipate heat through side surfaces thereof as well as through a back surface thereof, thereby increasing heat dissipation efficiency.

Additionally, the present invention also provides an MLF-type semiconductor package in which a stacked structure of a base substrate made of an electrically conductive material and a heat dissipating member is divided into a ground portion and an electrode portion that are electrically insulated from each other by a trench, and an electrode pattern is formed to connect the electrode portion to an input-and-output terminal of a semiconductor chip so that the semiconductor chip and an external circuit board can transmit and receive a signal through the electrode portion.

In addition, since the semiconductor chip is connected to the base substrate through the electrode pattern, it is unnecessary to perform a wire bonding process during manufacturing of the semiconductor package. Therefore, a method for manufacturing the semiconductor package is simplified. In addition, the width, length, and thickness of the electrode pattern can be easily controlled as desired.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
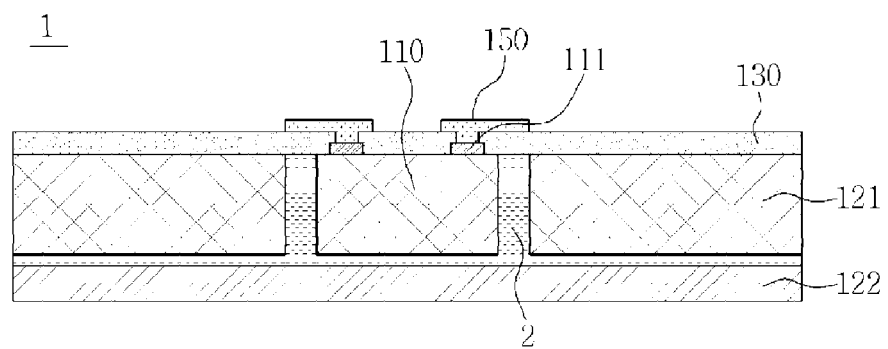
FIG. 1 is a cross-sectional view illustrating a conventional semiconductor package.

The above and other objects, features, and other advantages of the present invention will be more clearly understood from the following detailed description when taken in conjunction with the accompanying drawings. Throughout the drawings, the same reference numerals will refer to the same or like parts. It will be understood that, although the terms "first," "second," "first surface," "second surface," etc. may be used herein to describe various elements, these elements should not be limited by these terms. These terms are only used to distinguish one element from another element. Repeated descriptions and descriptions of known functions and configurations which have been deemed to make the gist of the present invention unnecessarily obscure will be omitted below.

Hereinafter, a first embodiment of the present invention will be described in detail with reference to the accompanying drawings.

Figure 2:
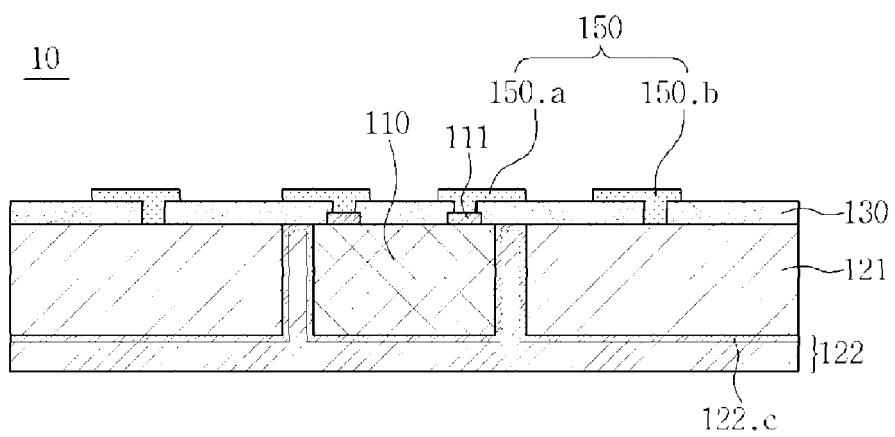
FIG. 2 is a cross-sectional view illustrating a semiconductor package according to a first embodiment of the present invention.

FIG. 2 is a cross-sectional view illustrating a semiconductor package 10 according to the first embodiment of the present invention. As illustrated in FIG. 2, the semiconductor package 10 according to the first embodiment of the present invention includes a base substrate 121, a semiconductor chip 110, a heat dissipating member 122, an insulation layer 130, and an electrode pattern 150.

The base substrate 121 is provided with at least one cavity 180 and made of a metallic material. At least one semiconductor chip 110 is mounted in the cavity 180. The heat dissipating member 122 is arranged in a gap between an inner surface of the cavity and the semiconductor chip 110.

The base substrate 121 is made of a metallic material that is electrically conductive and has a high thermal conductivity. For example, the base substrate 121 may be made of copper (Cu), aluminum (Al), silver (Ag), graphene, or a metal alloy. Specifically, copper (Cu) has a thermal conductivity of 400 W/mK, and aluminum (Al) has a thermal conductivity of 204 W/mK. Therefore, preferably, the base substrate may be made of copper (Cu) or aluminum (Al) due to high thermal conductivity thereof.

The base substrate 121 having high thermal conductivity provides a heat dissipation path to effectively dissipate heat generated by the semiconductor chip 110. Since the base substrate 121 is made of an electrically conductive material, the base substrate 121 itself can be used as a terminal for transferring an input or output signal of the semiconductor chip 110 to or from an external device, or as a ground terminal connected to a ground (GND).

Figure 6:
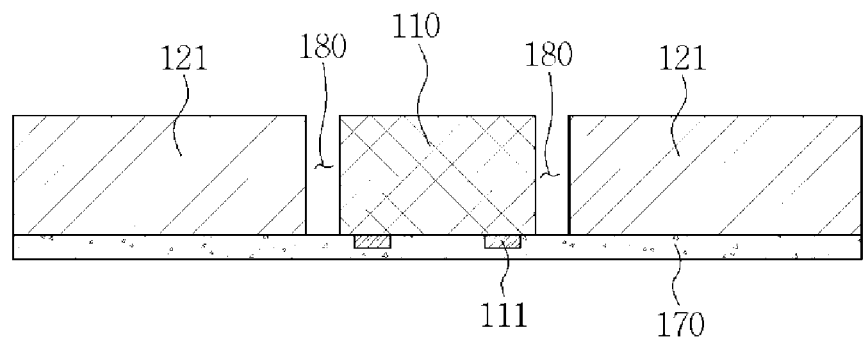
FIGS. 6 to 9 are cross-sectional views illustrating sequence of a method for manufacturing the semiconductor package according to the first embodiment of the present invention.
Figure 25:
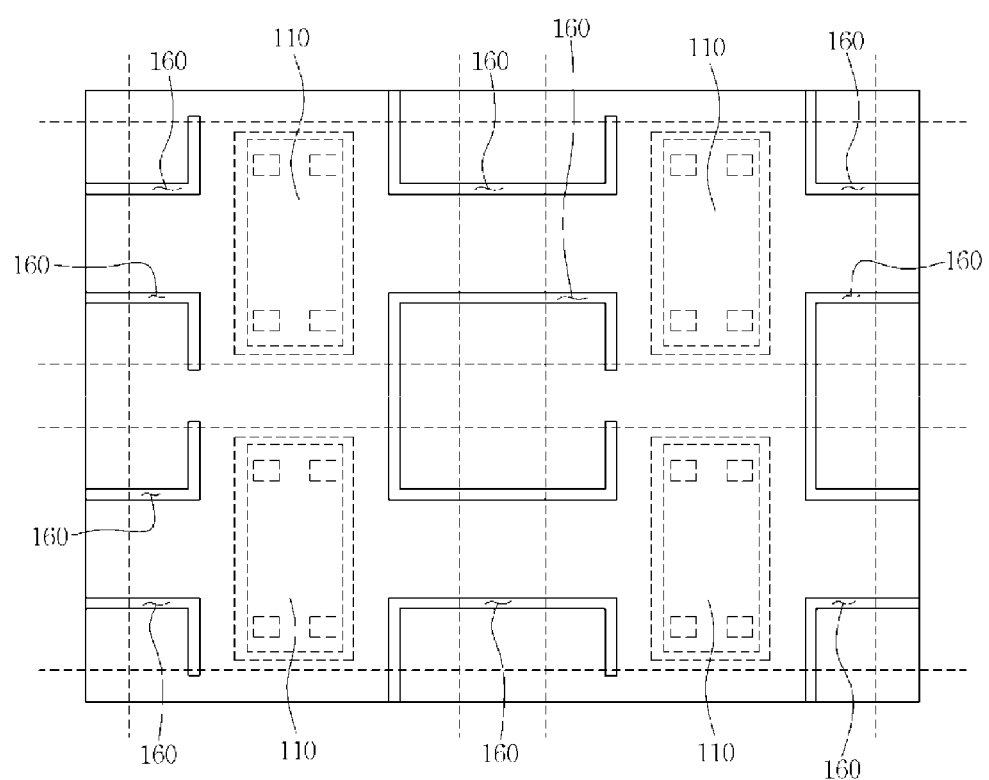
FIG. 25 is a plan view illustrating a process in a method for manufacturing a plurality of semiconductor packages at the same time.

As illustrated in FIG. 6, the base substrate 121 is provided with at least one cavity 180 to accommodate the semiconductor chip 110. As illustrated in FIG. 25, the base substrate 121 can be provided with a plurality of cavities 180. The size and shape of the cavity 180 are determined according to the shape of the semiconductor chip 110 to be accommodated in the cavity 180. Since the semiconductor chip 110 is mounted in the cavity 180, the total thickness of a semiconductor package can be reduced, resulting in a thin lightweight semiconductor package.

With reference to FIG. 2, a first surface of the semiconductor chip 110, provided with an electrode pad 111 thereon, is called hereinafter "front surface" or "active surface". A package type in which the front surface of the semiconductor chip 110 faces up is called a face-up type.

Since the semiconductor chip 110 is assembled in a face-up type package, an electrode pattern can be formed on the front surface of the semiconductor chip 10, and respective side surfaces and a back surface of the semiconductor chip 110 can be used as heat dissipation paths. Alternatively, the semiconductor chip 110 may be assembled such that the front surface of the semiconductor chip 110 faces down in a semiconductor package. Whether the semiconductor chip 110 faces up or down is not limited to the example of the present embodiment.

In addition, the kind of the semiconductor chip 110 is also not limited. A plurality of semiconductor chips 110 can be assembled in one semiconductor package, in which the semiconductor chips 110 can be the same kind or different kinds.

As illustrated in FIG. 2, the heat dissipating member 122 is arranged in the gap between the inner surface of the cavity 180 and the semiconductor chip 110. The heat dissipating member 122 is made of a material that is electrically conductive and has high thermal conductivity. The heat dissipating member 122 can be made of the same material as the base substrate 121. That is, the heat dissipating member 122 may be made of a metallic material such as copper (Cu), aluminum (Al), or a metal alloy. Alternatively, the base substrate 121 and the heat dissipating member 122 may be made of different materials.

Since the gap is filled with the heat dissipating member 122, the heat generated by the semiconductor chip 110 is conducted from the side surfaces of the semiconductor chip 110 to the base substrate 121 through the heat dissipating member 122. Since the heat dissipating member 122 is made of a material with high thermal conductivity, the semiconductor package has high heat dissipation efficiency.

In addition, the heat dissipating member 122 encapsulates the back surface and the side surfaces of the semiconductor chip 110 and covers the back surface of the base substrate 121.

That is, as illustrated in FIG. 2, the heat dissipating member 122 is provided in the gap between the side surfaces of the semiconductor chip 110 and the inner surface of the cavity 180 and on the back surface of the semiconductor chip 110, thereby covering the side surfaces and the back surface of the semiconductor chip 110.

The heat generated by the semiconductor chip 110 is discharged outside the semiconductor package along a first conduction path that leads from the back surface of the semiconductor chip 110 to the heat dissipating member 122 that is in contact with the back surface of the semiconductor chip 110. In addition, the heat is also discharged along a second conduction path that leads from the side surfaces of the semiconductor chip 110 to the heat dissipating member 122 that is in contact with the side surfaces of the semiconductor chip 110, then to the base substrate 121, and finally to the heat dissipating member 122 that is in contact with the back surface of the base substrate 121.

That is, in the case of the semiconductor package 10 according to the first embodiment of the present, since heat dissipation occurs through the side surfaces of the semiconductor chip 110 as well as the back surface, the semiconductor package 10 has a large heat dissipation area.

As illustrated in FIG. 2, a seed layer 122.c is a part of the heat dissipating member 122 and it functions to combine the heat dissipating member 122 with the semiconductor chip 110 and the base substrate 121. The seed layer 122.c is formed on the side surfaces and the back surface of the semiconductor chip 110, the back surface of the base substrate 121, and the inner surface of the cavity 180.

The seed layer 122.c is formed of a metal such as Ti, Ni, Cu, Al, or Ag. That is, the seed layer 122.c is made of a material that is electrically conductive and has high thermal conductivity. The seed layer 122.c is formed through sputtering, chemical vapor deposition (CVD), or the like.

The seed layer 122.c is included in the semiconductor package only when the heat dissipating member 122 is formed through plating, deposition, or the like. That is, the seed layer 122.c is optional in the semiconductor package 10 according to the first embodiment. When the seed layer 122.c is not included in the semiconductor package 10, the heat dissipating member 122 is formed to be in direct contact with the semiconductor chip 110 and the base substrate 121.

As illustrated in FIG. 2, the insulation layer 130 is provided on the front surface of the base substrate 121 and the front surface of the semiconductor chip 110. The insulation layer 130 protects the base substrate 121 and the semiconductor chip 110, and electrically insulates passive devices (not illustrated) (if provided on the base substrate 121) from the base substrate 121 and the semiconductor chip 110.

Figure 8:
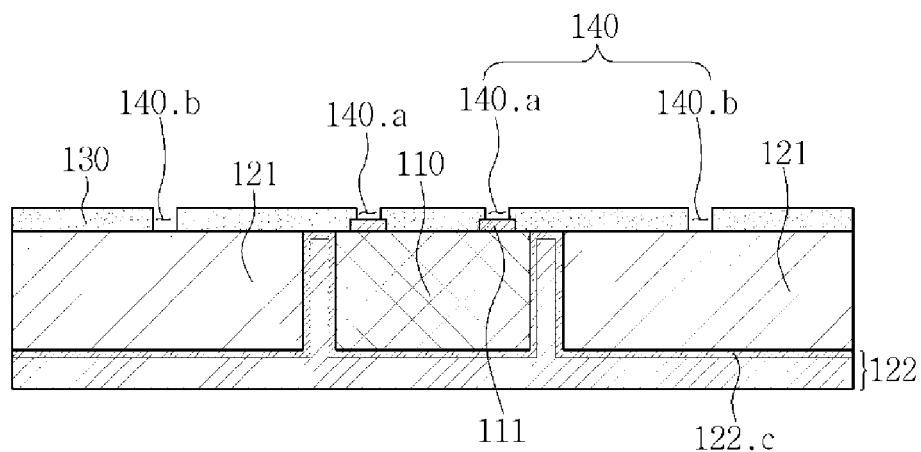

As illustrated in FIG. 8, the insulation layer 130 is provided with a plurality of via holes 140. The via holes 140 include a first via hole 140.a leading to the electrode pad 111 of the semiconductor chip 110 and a second via hole 140.b leading to the base substrate 121.

In addition, the electrode pattern 150 is formed on the front surface of the base substrate 121 and is electrically connected to the base substrate 121. The number of electrode patterns 150 is at least one.

That is, as illustrated in FIGS. 2 and 8, the electrode pattern 150 is formed on the surface of the insulation layer 130 and includes a first electrode pattern 150.a that is connected to an input-and-output terminal of the semiconductor chip 110 through the first via hole 140.a and a second electrode pattern 150.b that is electrically connected to the base substrate 121 through the second via hole 140.b.

The number of the first via holes 140.*a* and the number of the first electrode patterns 150.*a* may be one or more and is equal to the number of the electrode pads 111 of the semiconductor chip 110. An external circuit and the semiconductor chip 110 can transmit and receive an electrical signal through the first electrode pattern 150.*a*. The second via hole 140.*b* and the second electrode pattern 150.*b* are formed as necessary, for example, when the base substrate 121 is used as a ground (GND) or when they are required in the design of the semiconductor package or circuit.

Since the base substrate 121 can serve as a ground (GND) due to the presence of the second electrode pattern 150.*b*, flexibility is increased in designing a circuit using the semiconductor chip 110.

The semiconductor package 10 according to the first embodiment of the present invention can dissipate heat through the side surfaces of the semiconductor chip 110 as well as the back surface because it has the structure in which the semiconductor chip 110 is mounted in the cavity of the base substrate 121 made of a metallic material that is electrically conductive and has high thermal conductivity, and the gap between the base substrate 121 and the semiconductor chip 110 is filled with the heat dissipating member 122 made of a metallic material that is electrically conductive and has high thermal conductivity. Therefore, there is an effect that heat dissipation efficiency is increased.

Hereinbelow, a conventional semiconductor package 1 illustrated in FIG. 1 and the semiconductor package 10 according to the first embodiment of the present invention will be compared with each other.

The conventional semiconductor package 1 includes a silicon-based base substrate 121 provided with a cavity 180 and a semiconductor chip 110 arranged in a cavity 180 of the base structure 121, with a gap between an inner surface of the cavity and the semiconductor chip 110. An electrically conductive epoxy or a eutectic bonding layer 2 is arranged in the gap, thereby fixing the base substrate 121 and a heat dissipating member 122 to the semiconductor chip 110.

This bonding layer 2 has low thermal conductivity and thus has low heat dissipation efficiency because heat cannot be easily conducted from the semiconductor chip 110 to the heat dissipating member 122 through the bonding layer 2 due to the low thermal conductivity of the bonding layer 2.

Furthermore, when heat is transferred from the side surfaces of the semiconductor chip 110 to the base substrate 121 through the bonding layer 2, since the base substrate 121 is made of silicon having low thermal conductivity, heat dissipation efficiency is low.

Therefore, heat dissipation occurs only through the back surface of the semiconductor chip 110, and nearly no heat is dissipated through the side surfaces of the semiconductor chip 110.

Meanwhile, in the semiconductor package 10 according to the first embodiment of the present invention, heat of the semiconductor chip 110 is dissipated from the semiconductor package in such a way that it is conducted from the back surface of the semiconductor chip 110 to the heat dissipating member 122 that is in contact with the semiconductor chip 110 and is then radiated outside from the heat dissipating member 122 in contact with the back surface of the base substrate 121. Simultaneously, the heat is also dissipated in a way that it is conducted from the side surfaces of the semiconductor chip 110 to the heat dissipating member 122 that is in contact with the side surfaces of the semiconductor chip 110, then to the base substrate 121, then to the heat dissipating member 122 that is in contact with the back surface of the base substrate 121, and is finally radiated outside from the heat dissipating member 122 in contact with the back surface of the base substrate 121.

In this way, the semiconductor package 10 according to the first embodiment of the present invention dissipates heat of the semiconductor 110 through the side surfaces of the semiconductor chip 110 as well as the back surface. That is, the semiconductor package 10 has a large heat dissipation area.

For example, when a typical semiconductor chip 110 that has a rectangular parallelepiped shape that is 0.5 mm, 0.5 mm, and 0.1 mm in length, width, and height is assembled in the semiconductor package 10 according to the first embodiment of the present invention, the area of the back surface of the semiconductor chip 110 is $0.5 \times 0.5 = 0.25$ mm$^2$, and the area of the side surfaces of the semiconductor chip 110 is $0.5 \times 0.1 \times 4 = 0.2$ mm$^2$. Therefore, the semiconductor chip 110 has a total heat dissipation area of $0.25 + 0.2 = 0.45$ mm$^2$. Accordingly, in comparison with a conventional semiconductor package having only a heat dissipation area of 0.25 mm$^2$ (corresponding to an area of the back surface of the semiconductor chip 110), the semiconductor package 10 according to the first embodiment of the present invention has a heat dissipation area increased by about 80%, thereby dramatically increasing heat dissipation efficiency.

Hereinafter, a second embodiment of the present invention will be described with reference to the accompanying drawings.

Figure 3:
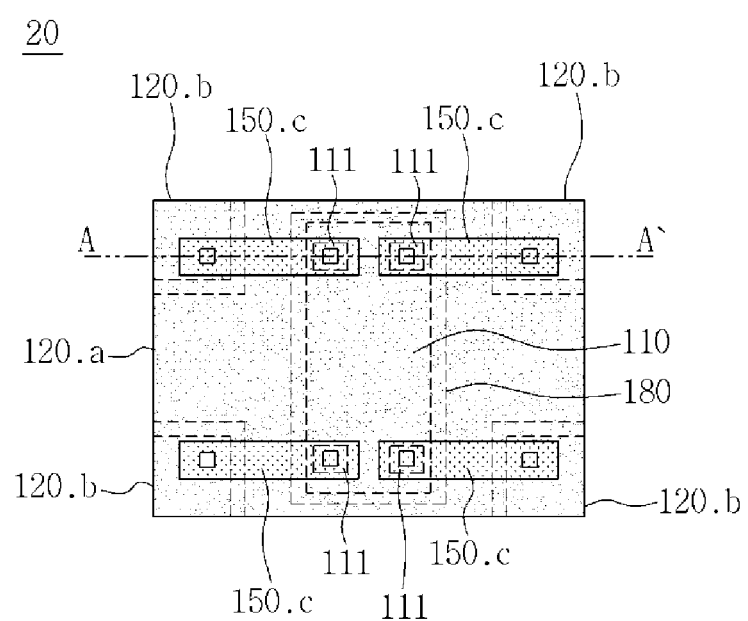
FIG. 3 is a plan view illustrating a semiconductor package according to a second embodiment of the present invention.
Figure 4:
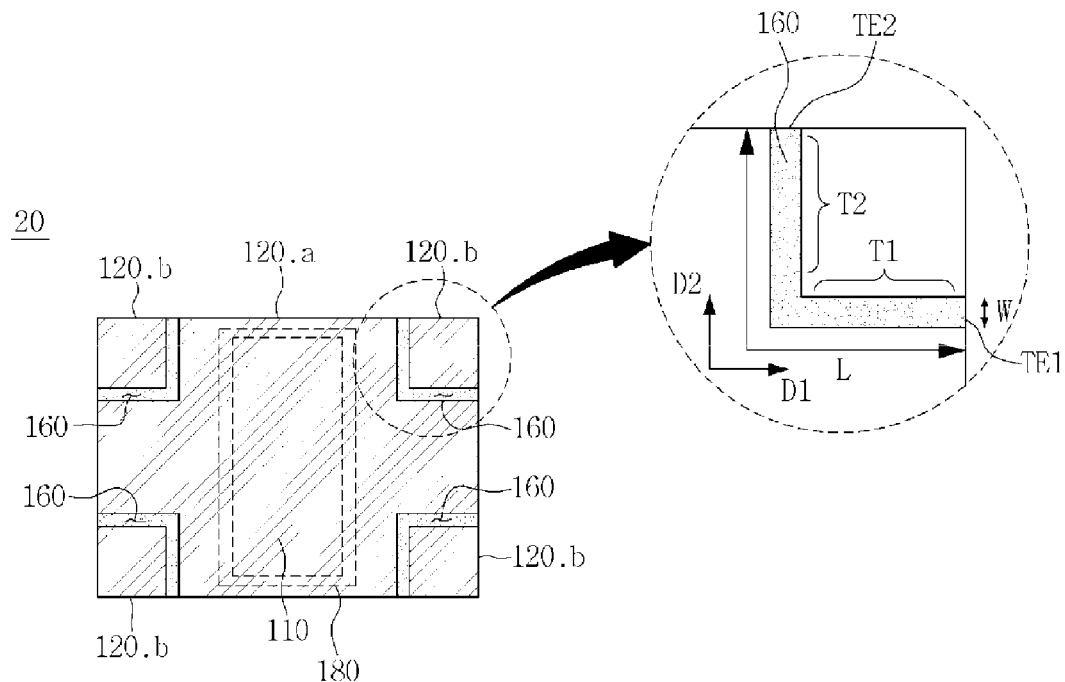
FIG. 4 is a bottom view of the semiconductor package of FIG. 3.
Figure 5:
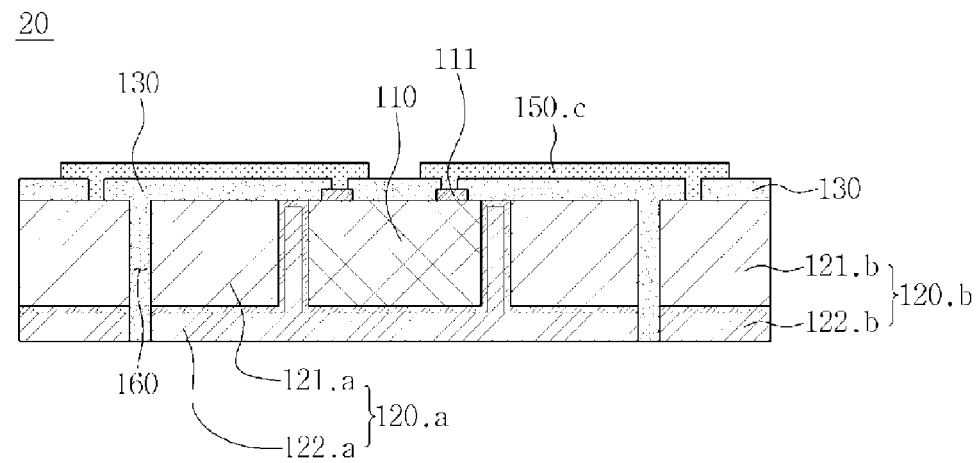
FIG. 5 is a cross-sectional view taken along a line A-A' of FIG. 3.

FIG. 3 is a plan view illustrating a semiconductor package 20 according to the second embodiment of the present invention. FIG. 4 is a bottom view of the structure of FIG. 3, and FIG. 5 is a cross-sectional view taken along a line A-A' of FIG. 3. As illustrated in FIGS. 3 to 5, the semiconductor package 20 according to the second embodiment of the present invention includes a base substrate 121, a semiconductor chip 110, a heat dissipating member 122, a trench 160, an insulation layer 130, and an electrode pattern 150.

A description about the base substrate 121, the semiconductor chip 110, and the heat dissipating member 122 that are substantially similar to those of the first embodiment of the present invention will be omitted. A description of the second embodiment will be mainly about elements that are different from those of the first embodiment.

As illustrated in FIGS. 4 and 5, the semiconductor package 20 according to the second embodiment of the present invention further includes at least one trench 160 that sequentially extends through the base substrate 121 and the heat dissipating member 122 in a thickness direction thereof and thus divides a stacked structure of the base substrate 121 and the heat dissipating member 122 into a ground portion 120.*a* and an electrode portion 120.*b* and electrically insulates the ground portion 120.*a* and the electrode portion 120.*b* from each other.

That is, as illustrated in FIG. 5, the trench 160 is formed in the stacked structure of the base substrate 121 and the heat dissipating member 122. Specifically, the trench 160 is a through-hole that extends vertically from the front surface of the base substrate 121 to the back surface of the heat dissipating member 122. As illustrated in FIGS. 3 and 4, the trench 160 divides the stacked structure of the base substrate 121 and the heat dissipating member 122 into the ground portion 120.*a* and the electrode portion 120.*b* and electrically insulates the ground portion 120.*a* and the electrode portion 120.*b* from each other.

As illustrated in FIG. 5, the ground portion 120.*a* includes a first base substrate 121.*a* within which the semiconductor chip 110 is arranged and a first heat dissipating member 122.*a* that covers the back surface of the first base substrate 121.*a*, and the electrode portion 120.*b* includes a second base substrate 121.*b* electrically connected to the first base substrate 121.*a* and a second heat dissipating member 122.*b* that covers the back surface of the second base substrate 121.*b*.

That is, as illustrated in FIG. 4, the ground portion 120.*a* includes: the first base substrate 121.*a*, which is a portion of the base substrate 121 and has a cavity 180 in which the semiconductor chip 110 is accommodated; and the first heat dissipating member 122.*a* that extends over a gap between the semiconductor chip 110 and an inner surface of the cavity 180 and covers the back surface of the first base substrate 121.*a*.

Similarly to the first embodiment of the present invention, since the first base substrate 121.*a* and the first heat dissipating member 122.*a* are made of an electrically conductive material, the ground portion 120.*a* can be used as a terminal for transmitting and receiving an input or output signal of the semiconductor chip 110 to and from outside of the semiconductor package or used as a ground terminal connected to a ground (GND).

As illustrated in FIG. 4, the electrode portion 120.*b* includes the second base substrate 121.*b* that is electrically insulated from the first base substrate 121.*a* and the second heat dissipating member 122.*b* that covers the back surface of the second base substrate 121.*b*.

Since the second base substrate 121.*b* and the second heat dissipating member 122.*b* are made of an electrically conductive material, and the electrode portion 120.*b* is electrically insulated from the ground portion 120.*a* by the trench 160, the electrode portion 120.*b* can be used as an input-and-output terminal for input and output of an electrical signal. Since the electrode portion 120.*b* that is a portion of the stacked structure of the base substrate 121 and the heat dissipating member 122 can be used as the input-and-output terminal, a compact semiconductor package that is thin and lightweight can be provided.

As illustrated in FIGS. 4 and 5, the trench 160 vertically extends from the front surface of the base substrate 121 to the back surface of the heat dissipating member 122, thereby passing through the base substrate 121 in the thickness direction thereof. The trench 160 is an L-shaped hole having a length L and a width W when viewing the surface of the base substrate 121.

Specifically, as illustrated in FIG. 4, the trench 160 consists of a first portion T1 extending in a first direction and having a predetermined length and a second portion T2 extending in a second direction (different from the first direction) from an end of the first portion T1 and having a predetermined length.

To electrically insulate the electrode portion 120.*b* from the ground portion 120.*a*, the trench 160 surrounds the electrode portion 120.*b* in a manner that the first portion T1 extends in the first direction by the predetermined length and the second portion extends in the second direction by the predetermined length. Thus, the trench 160 has a letter "L" shape. The first portion T1 and second portion T2 of the trench 160 extend up to the edges of the stacked structure of the base substrate 121 and the heat dissipating member 122, so that a first end TE1 of the trench 160 (also referred to as an outside end TE1 of the first portion T1) and a second end TE2 of the trench 160 (also referred to as an outside end of the second portion T1) are flush with two side surfaces of the stacked structure of the base substrate 121 and the heat dissipating member 122, thereby electrically insulating the ground portion 120.*a* and the electrode portion 120.*b* from each other.

More specifically, the trench 160 including the first portion T1 extending in a widthwise direction D1 of the base substrate 121 and having a predetermined length and the second portion T2 extending in a lengthwise direction D2 of the base substrate 121 and having a predetermined length, physically separates the electrode portion 120.*b* from the ground portion 120.*a* by a predetermined distance.

That is, as illustrated in FIG. 4, since the trench 160 includes the first portion T1 extending in the widthwise direction D1 of the base substrate 121 and having a predetermined length and a predetermined width and the second portion T2 extending in the lengthwise direction D2 of the base substrate 121 and having a predetermined length and a predetermined width, the trench 160 has an overall letter "L" shape when viewing the surface of the base substrate 121.

The number of trenches 160 depends on the number of electrode portions 120.*b* required. The electrode portions 120.*b* are provided in the corners of the base substrate 121 and the number of electrode portions 120.*b* equals the number of electrode pads 111 formed in the semiconductor chip 110.

That is, as illustrated in FIG. 3, the semiconductor chip 110 may have four electrode pads 111. In this case, to form four electrode portions 120.*b* corresponding to the four electrode pads 111, four trenches 160 are formed near the respective corners of the semiconductor chip 110. Thus, four electrode portions 120.*b* electrically insulated from the ground portion 120.*a* are formed.

The shape of the trench 160 can be modified according to the position, shape, and size of the electrode portion 120.*b* and also can be changed according to the design of the semiconductor package.

As illustrated in FIG. 5, the insulation layer 130 covers the front surface of the semiconductor chip 110 and the front surface of the base substrate 121 and extends over the trench 160. The insulation layer 130 electrically insulates the ground portion 120.*a* and the electrode portion 120.*b* from each other, protects the base substrate 121 and the semiconductor chip 110, and electrically insulates the semiconductor chip 110 and the base substrate 121 from passive devices (not illustrated, if provided on the base substrate 121).

Figure 18:
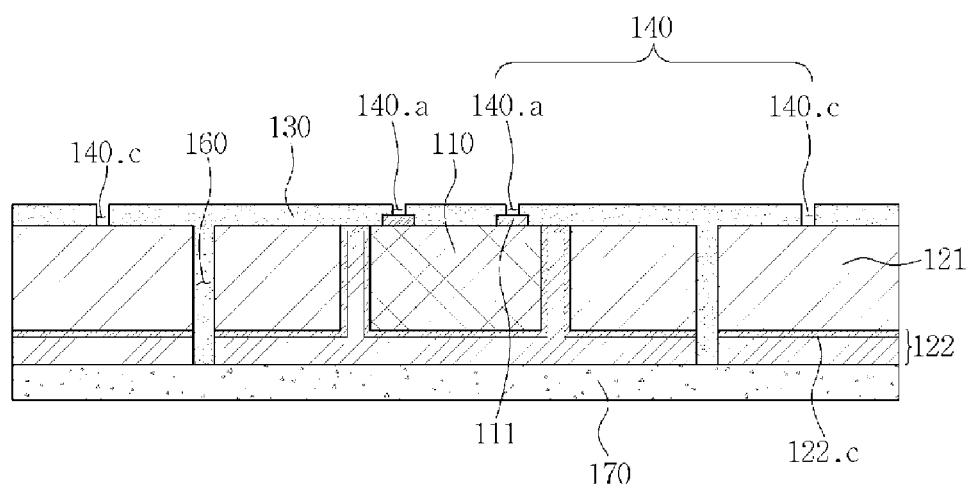
FIG. 18 is a cross-sectional view taken along a line A-A' of FIG. 16.

As illustrated in FIG. 18, via holes 140 are formed in the insulation layer 130. The via holes 140 includes a first via hole 140.*a* leading to the electrode pad 11 of the semiconductor chip 110 and a third via hole 140.*b* leading to the second base substrate 121.*b* of the electrode portion 120.*b*.

As illustrated in FIG. 5, a third electrode pattern 150.*c* is formed on the surface of the insulation layer 130. A first end of the third electrode pattern 150.*c* is connected to the electrode pad 111 through the first via hole 140.*a*, and a second end of the third electrode pattern 150.*c* is connected to the second base substrate 121.*b* through the third via hole 140.*c*. That is, the electrode pad 111 of the semiconductor chip 110 and the electrode portion 120.*b* are connected to each other through the third electrode pattern 150.*c*. Therefore, an input or output signal of the semiconductor chip 110 is transmitted to and from an external circuit through the electrode portion 120.*b*. The structure described above is called Micro-Lead Frame (MLF) semiconductor package.

The semiconductor package 20 according to the second embodiment of the present invention is an MLF semiconductor package in which the stacked structure of the base substrate 121 and the heat dissipating member 122 that are made of a conductive material is divided into the ground portion 120.*a* and the electrode portion 120.*b* by the trench 160 so as to be electrically insulated from each other and in which the electrode portion 120.*b* and the electrode pad 111 of the semiconductor chip 110 are connected to each other through the third electrode pattern 150.c so that a signal can be transmitted between an external circuit board and the semiconductor chip 110 through the electrode portion 120.b.

In addition, for the purpose of connection between the semiconductor chip 110 and the semiconductor package, the electrode pattern 150.c is formed. Therefore, a wire bonding process to connect a semiconductor chip to a semiconductor package is unnecessary. That is, it is unnecessary to perform a thermocompression process, an ultrasonic bonding process, and a tape automated bonding (TAB) process that are required for wire bonding. Furthermore, it is possible to save a space required for wire bonding. Yet furthermore, it is possible to adjust a conduction path, width, length, thickness, and position of the electrode pattern 150 as necessary, thereby reducing inductance-related problems that occur at high frequencies in a wire bonding structure. Therefore, the present invention can provide a semiconductor package that can be applied to a power semiconductor device involving high voltages and high currents.

Figure 7:
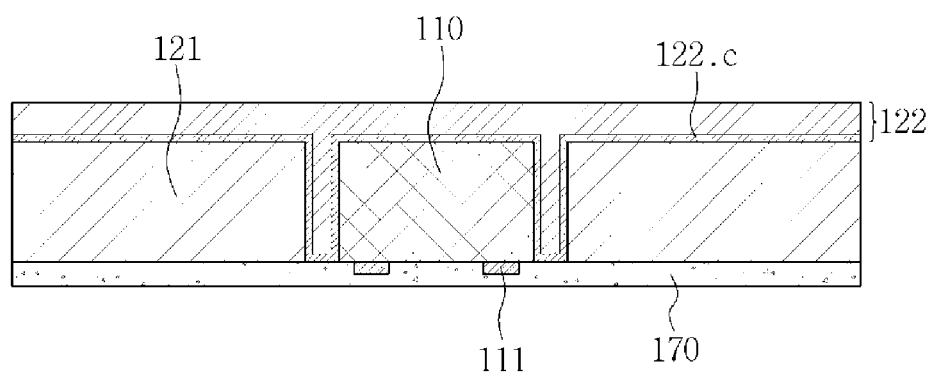

Hereinafter, a method for manufacturing the semiconductor package 10 according to the first embodiment of the present invention will be described with reference to the accompanying drawings. FIGS. 6 to 9 are cross-sectional views showing sequence of the manufacturing method of the semiconductor package 10 according to the first embodiment of the present invention. In FIGS. 6 and 7, the front surfaces of the semiconductor chip 110 and the base substrate 121 are arranged to face down.

As illustrated in FIGS. 6 to 9, the method for manufacturing the semiconductor package 10 according to the first embodiment of the present invention includes the following steps: a cavity formation step S11 for forming at least one cavity 180 in the base substrate 121 made of a metallic material; a semiconductor chip mounting step S12 for mounting the semiconductor chip 110 in the cavity 180; a heat dissipating member formation step S13 for forming the heat dissipating member 122 so as to fill the gap between the inner surface of the cavity 180 and the semiconductor chip 110 and to cover the back surface of the base substrate 121; an insulation layer formation step S14 for forming the insulation layer 130 on the front surface of the base substrate 121; and an electrode pattern formation step S15 for forming the electrode pattern 150 electrically connected to the semiconductor chip 110 and the electrode pattern 150 electrically connected to a portion of the base substrate 121, on the insulation layer 130.

Specifically, as illustrated in FIG. 6, at the cavity formation step S11, a metal substrate serving as the base substrate 121 is prepared, and at least one cavity 180 having a shape corresponding to the shape of the semiconductor chip 110 is formed in the base substrate 121. When the base substrate 121 is a metal substrate made of copper (Cu) or aluminum (Al), the cavity 180 is formed through mechanical drilling, laser drilling, or reactive ion etching (RIE).

Next, as illustrated in FIG. 6, at the semiconductor chip mounting step S12, a carrier sheet 170 is attached to the front surface of the base substrate 121 having the cavity 180 formed therein. The carrier sheet 170 functions to fix the semiconductor chip 110 and the base substrate 121 not to be displaced because the base substrate 121 and the semiconductor chip 110 are separated from each other. Specifically, the carrier sheet 170 fixes the semiconductor chip 110 and the base substrate 121 such that the front surface of the semiconductor chip 110 is flush with the front surface of the base substrate 121. The carrier sheet 170 may be an adhesive sheet. Subsequently, as illustrated in FIG. 6, the semiconductor chip 110 is put in the cavity 180 such that the front surface of the semiconductor chip 110, on which an electrode pad 111 is formed, faces down. Alternatively, according to the design of a semiconductor package, the semiconductor chip 110 may be put such that the front surface thereof faces up.

Next, as illustrated in FIG. 7, at the heat dissipating member formation step S13, the heat dissipating member 122 is formed to fill the gap between the inner surface of the cavity 180 and the semiconductor chip 110 and to cover the back surface of the base substrate 121. At the heat dissipating member formation step S13, the seed layer 122.c is first formed and the heat dissipating member 122 is then formed.

Specifically, the seed layer 122.c is primarily formed to make the heat dissipating member 122 well combined with the semiconductor chip 110 and the base substrate 121. As illustrated in FIG. 7, the seed layer 122.c is formed on the side surfaces and the back surface of the semiconductor chip 110, the inner surface of the cavity 180, and the back surface of the base substrate 121. The seed layer 122.c can be formed through sputtering, chemical vapor deposition (CVD), or the like. The seed layer 122.c is made of a metal that is electrically conductive and has high thermal conductivity. For example, the seed layer 122.c is made of Ti, Ni, Cu, Al, or Ag.

The seed layer 122.c is formed when the heat dissipating member 122 is formed through a plating method or a deposition method. Alternatively, the seed layer 122.c may not be formed. In this case, the heat dissipating member 122 is formed directly on the semiconductor chip 110 and the base substrate 121.

The heat dissipating member 122 may be formed of a metallic material that is electrically conductive and has high thermal conductivity. For example, the heat dissipating member 122 can be formed of copper (Cu) or aluminum (Al) through physical vapor deposition (PVD), electro-chemical deposition (ECD), chemical vapor deposition (CVD), electroplating, or chemical plating.

After the heat dissipating member 122 is formed, the carrier sheet 170 is removed because the base substrate 121 and the semiconductor chip 110 are fixed by the heat dissipating member 122. Next, the base substrate 121 and the semiconductor chip 110 are reversed such that the front surfaces of the base substrate 121 and the semiconductor chip 110 face up. This is to facilitate formation of the insulation layer 130 and the electrode pattern 150 on the front surfaces of the semiconductor chip 110 and the base substrate 121.

Next, as illustrated in FIG. 8, after the heat dissipating member 122 is formed, at the insulation layer formation step S14, the insulation layer 130 is formed on the front surface of the base substrate 121. The insulation layer 130 electrically insulates the semiconductor chip 110 and the base substrate 121 from passive devices (if provided on the base substrate 121).

After the insulation layer 130 is formed, via holes 40 are formed in the insulation layer 130. The via holes 140 include the first via hole 140.a leading to the electrode pad 111 of the semiconductor chip 110 and the second via hole 140.b leading to a portion of the base substrate 121. For formation of the via holes 140, semiconductor manufacturing processes such as photolithography and dry or wet etching can be used.

Figure 9:
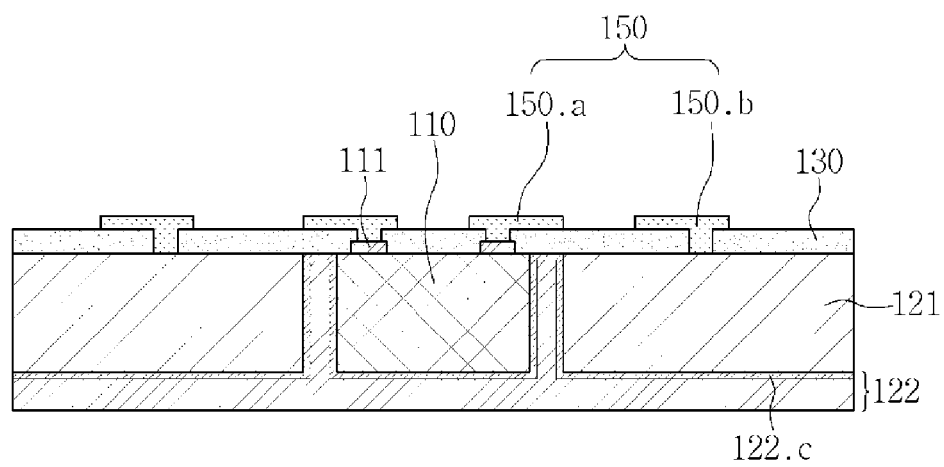

Next, as illustrated in FIG. 9, at the electrode pattern formation step S15, a first electrode pattern 150.a electrically connected to the semiconductor chip 110 and a second electrode pattern 150.b electrically connected to a portion of the base substrate 121 are formed on the insulation layer 130.

That is, the first electrode pattern 150.a is electrically connected to the electrode pad 111 of the semiconductor chip 110 through the first via hole 140.a, and the second electrode pattern 150.b is electrically connected to a portion of the base substrate 121 through the second via hole 140.b. The first electrode pattern 150.a and the second electrode pattern 150.b can be simultaneously formed. The first electrode pattern 150.a and the second electrode pattern 150.b can be formed sequentially performing the following semiconductor manufacturing processes: depositing a metal layer; performing photolithography on the metal layer; and performing dry or wet etching on the metal layer.

Although not illustrated in the drawings, back-grinding, chemical-mechanical polishing (CMP), film thinning, and stacking may be additionally performed.

Hereinafter, a method for manufacturing the semiconductor package 20 according to the second embodiment of the present invention will be described with reference to the drawings. FIGS. 10 to 24 are diagrams illustrating sequence of the manufacturing method of the semiconductor package 20 according to the second embodiment of the present invention.

The method for manufacturing the semiconductor package 20 according to the second embodiment of the present invention includes the following steps: a cavity formation step S21 for forming at least one cavity 180 in the base substrate 121 made of a metallic material; a semiconductor chip mounting step S22 for mounting the semiconductor chip 110 in the cavity 180; a heat dissipating member formation step S23 for forming the heat dissipating member 122 to fill the gap between the inner surface of the cavity 180 and the semiconductor chip 110 and to cover the back surface of the base substrate 121; and an area-dividing step S24 for dividing an assembled structure of the base substrate 121 and the heat dissipating member 122 into the ground portion 120.a within which the semiconductor chip 110 is mounted and the electrode portion 120.b that is on one side of the ground portion 120.a to electrically insulate the electrode portion 120.b from the ground portion 120.a.

The area-dividing step S24 includes a trench formation step S24.a, an insulation layer formation step S24.b, an electrode pattern formation step S24.c, and a dicing step S24.d. At the trench formation step S24.a, at least one trench 160 is formed at a boundary portion between the ground portion 120.a and the electrode portion 120.b. That is, trench 160 is formed in lengthwise direction and in widthwise direction to pass through the base substrate 121 and the heat dissipating member 122 in a thickness direction. As a result, the ground portion 120.a and the electrode portion 120.b are spaced from each other by the trench 160 formed therebetween. At the insulation layer formation step S24.b, the trench 160 is filled with an insulation material and the insulation layer 130 is formed on the front surface of the base substrate 121. At the electrode pattern formation step S24.c, the electrode pattern 150 that electrically connects the electrode pad 111 of the semiconductor chip 110 to the electrode portion 120.b is formed. At the dicing step S24.d, the stacked structure of the base substrate 121 and the heat dissipating member 122 undergoes a dicing process in which the stacked structure of the base substrate 121 and the heat dissipating member 122 is cut along dicing lines that extend to pass the first and second ends of the trench 160. Through this step, the ground portion 120.a and the electrode portion 120.b are completely electrically insulated from each other.

Figure 10:
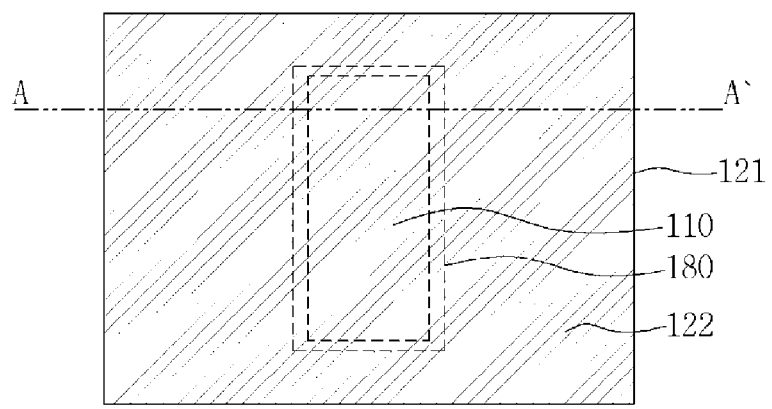
FIG. 10 is a plan view illustrating a first process in a method for manufacturing the semiconductor package according to the second embodiment of the present invention.
Figure 11:
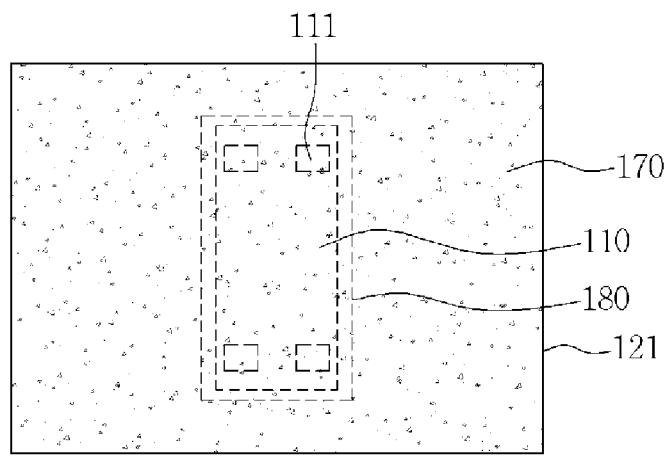
FIG. 11 is a bottom view of the structure of FIG. 10.
Figure 12:
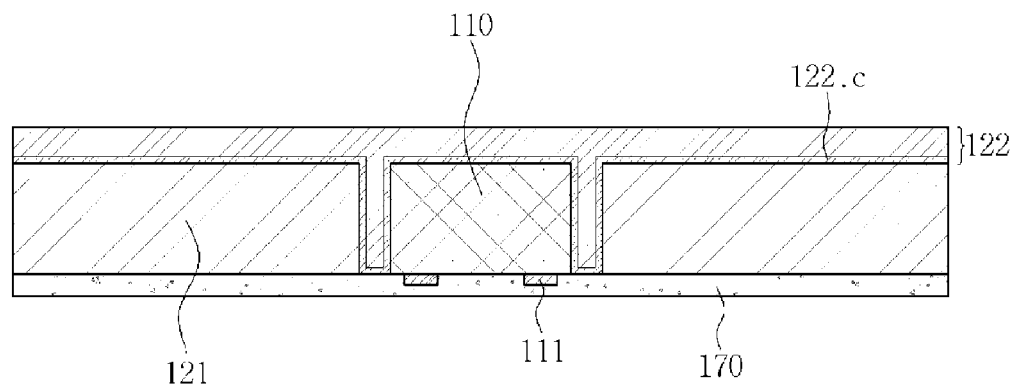
FIG. 12 is a cross-sectional view taken along a line A-A' of FIG. 10.

Since the cavity formation step S21, the semiconductor chip mounting step S22, and the heat dissipating member formation step S23 illustrated in FIGS. 10 to 12 are similar to those included in the manufacturing method of the semiconductor package 10 according to the first embodiment of the present invention, a description thereabout will be omitted.

As illustrated in FIGS. 10 and 11, in a plan view and a bottom view, the cavity 180 formed in the base substrate 121, the semiconductor chip 110 mounted in the cavity 180, and the electrode pad 111 of the semiconductor chip 110 are illustrated in dotted lines.

Figure 13:
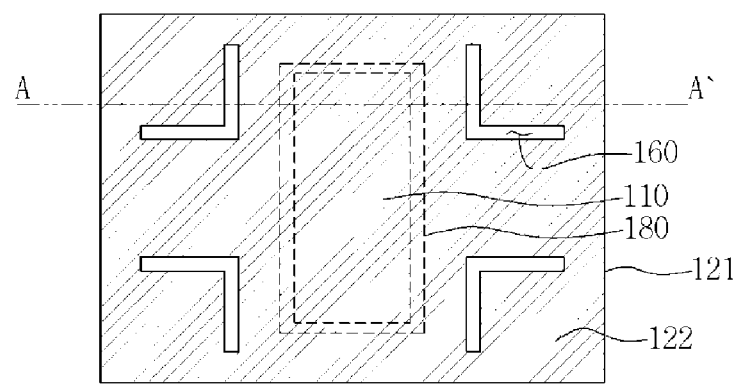
FIG. 13 is a plan view illustrating a second process in the method for manufacturing the semiconductor package according to the second embodiment of the present invention.
Figure 14:
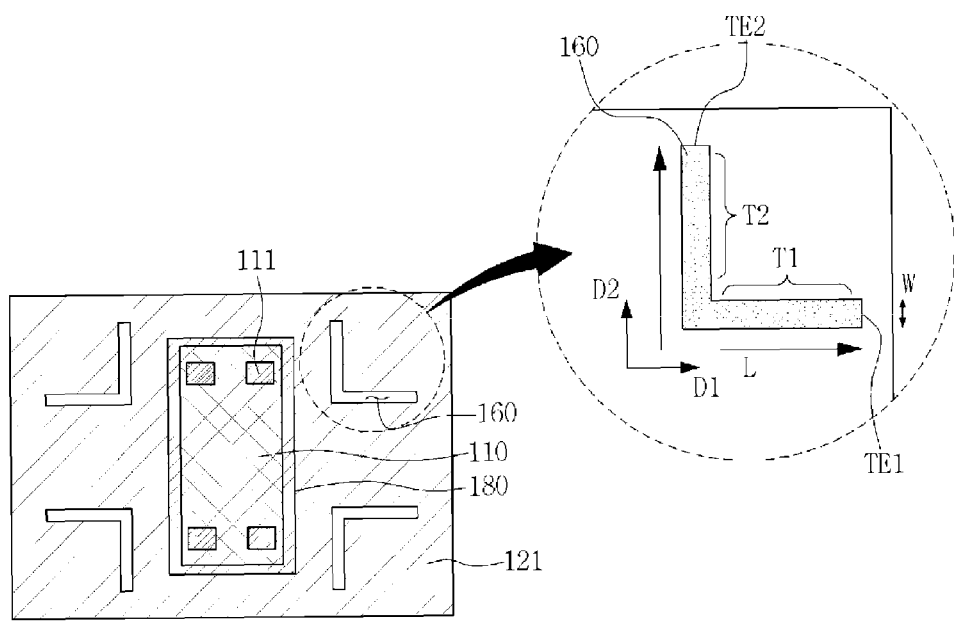
FIG. 14 is a bottom view of the structure of FIG. 13.
Figure 15:
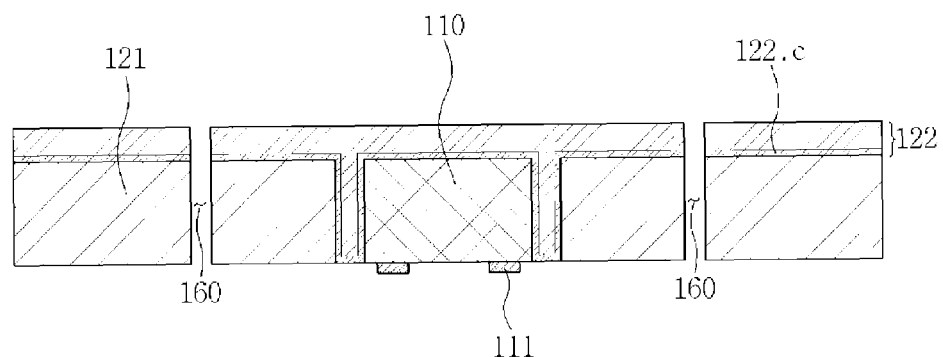
FIG. 15 is a cross-sectional view taken along a line A-A' of FIG. 13.

After the heat dissipating member mounting step S23, as illustrated in FIGS. 13 and 14, at the trench formation step S24.a, the stacked structure of the base substrate 121 and the heat dissipating member 122 is patterned to form at least one trench 160 that passes through the stacked structure of the base substrate 121 and the heat dissipating member 122 in a thickness direction thereof and has a pattern extending in a lengthwise direction and a widthwise direction of the base substrate 121. Due to the trench 160, the ground portion 120.a and the electrode portion 120.b are spaced from each other by a predetermined distance.

That is, as illustrated in FIGS. 13 to 14, the trench 160 includes the first portion T1 extending in the first direction of the base substrate 121 and having a predetermined length and the second portion T2 extending from an end of the first portion T1 in the second direction different from the first direction and having a predetermined length.

Specifically, the trench 160 is located at a boundary portion (see FIG. 23) between regions designed to serve as the ground portion 120.a and the electrode portion 120.b. The first portion T1 extends in the first direction and has the predetermined length. The trench 160 is formed in a letter "L" shape such that the second portion T2 extends in the second direction different from the first direction and has the predetermined length.

More specifically, as illustrated in FIG. 14, the trench 160 includes the first portion T1 extending in the widthwise direction D1 of the base substrate 121 and having the predetermined length and the second portion T2 extending in the lengthwise direction D2 of the base substrate 121 and having the predetermined length, and the trench 160 is located at the boundary portion between regions to serve as the ground portion 120.a and the electrode portion 120.b.

That is, as illustrated in FIG. 14, the trench 160 includes the first portion T1 extending in the widthwise direction D1 of the base substrate 121 and having a predetermined length and a predetermined width and the second portion T2 extending in the lengthwise direction D2 of the base substrate 121 and having a predetermined length and a predetermined width, thereby having an overall letter shape when viewing the surface of the base substrate 121.

As illustrated in FIG. 14, as to the trench 160, a first end TE1 and a second end TE2 thereof are distanced from the side surfaces of the stacked structure of the base substrate 121 and the heat dissipating member 122 by a predetermined distance. That is, through the trench formation step S24.a, the stacked structure of the base substrate 121 and the heat dissipating member 122 is divided into the ground portion 120.a and the electrode portion 120.b but the ground portion 120.a and the electrode portion 120.b are not yet electrically insulated from each other by the trench 160.

As illustrated in FIGS. 13 and 14, only one trench 160 may be formed for one semiconductor package. Alternatively, as illustrated in FIG. 25, in order to manufacture a plurality of semiconductor packages at the same time, a plurality of semiconductor chips 110 may be mounted in one base substrate 121, and a C-shaped trench 160 may be formed for four semiconductor packages. That is, one C-shaped trench 160 is formed by connecting four trenches corresponding to four semiconductor packages to each other.

At the trench formation step S24.a, reactive ion etching (RIE), mechanical drilling, or laser drilling can be used to form the trench 160 that extends through the stacked structure of the base substrate 121 and the heat dissipating member 122 in the thickness direction thereof.

As illustrated in FIG. 18, after the trench 160 is formed, the stacked structure of the base substrate 121 and the semiconductor chip 110 is reversed such that the front surface of the stacked structure of the base substrate 121 and the semiconductor chip 110 faces up to facilitate formation of the insulation layer 130 and the electrode pattern 150. Before forming the insulation layer 130, a carrier sheet 170 is attached to the back surface of the heat dissipating member 122.

Figure 16:
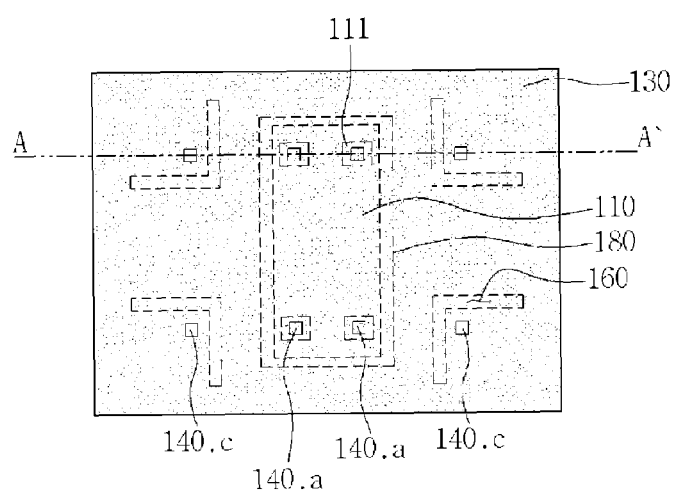
FIG. 16 is a plan view illustrating a third process in the method for manufacturing the semiconductor package according to the second embodiment of the present invention.
Figure 17:
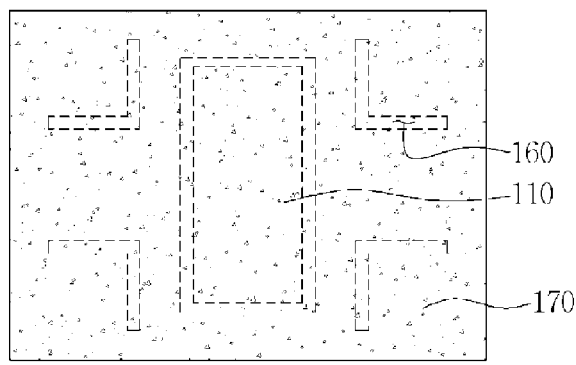
FIG. 17 is a bottom view of the structure of FIG. 16.

Next, as illustrated in FIGS. 16 to 18, at the insulation layer formation step S24.b, the trench 160 is filled with an insulation material and the insulation layer 130 is formed on the front surface of the base substrate 121.

That is, the trench 160 that is a through-hole extending through the base substrate 121 and the heat dissipating member 122 in the thickness direction is filled with the insulation material, thereby electrically insulating the ground portion 120.a and the electrode portion 120.b from each other. While the trench 160 is filled with the insulation material, the insulation layer 130 that is integral to the insulation material formed in the trench 160 is formed on the front surface of the base substrate 121.

After the insulation layer 130 is formed, the carrier sheet 170 is removed, and then a first via hole 140.a leading to the electrode pad 111 of the semiconductor chip 110 and a third via hole 140.c leading to the second base substrate 121.b of the electrode portion 120.b are formed in the insulation layer 130. At this step, existing manufacturing process such as photolithography and dry or wet etching can be used.

Figure 19:
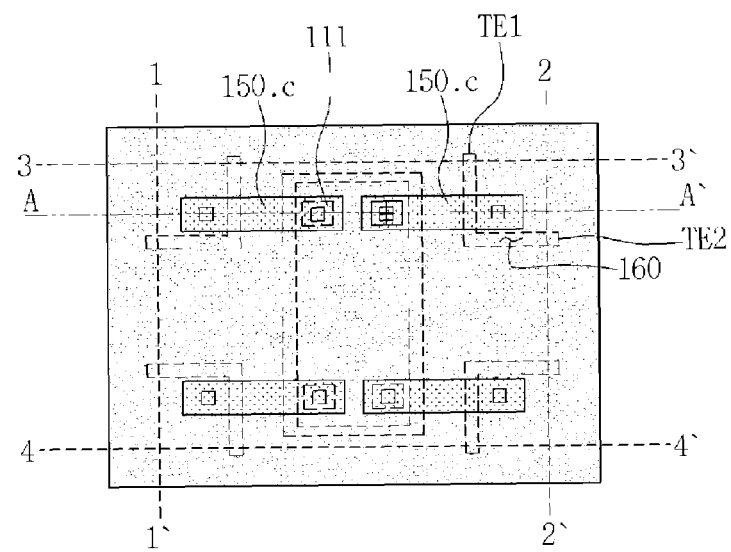
FIG. 19 is a plan view illustrating a fourth process in the method for manufacturing the semiconductor package according to the second embodiment of the present invention.
Figure 20:
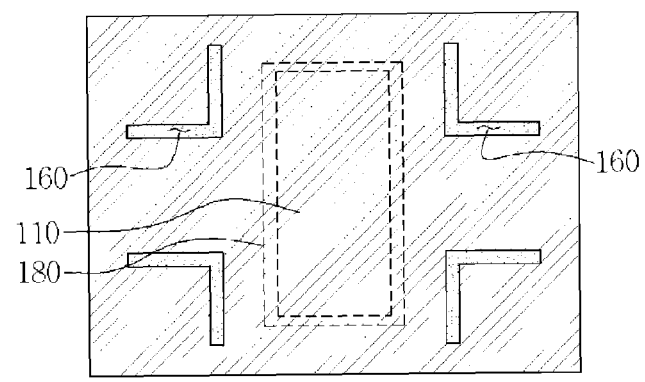
FIG. 20 is a bottom view of the structure of FIG. 19.
Figure 21:
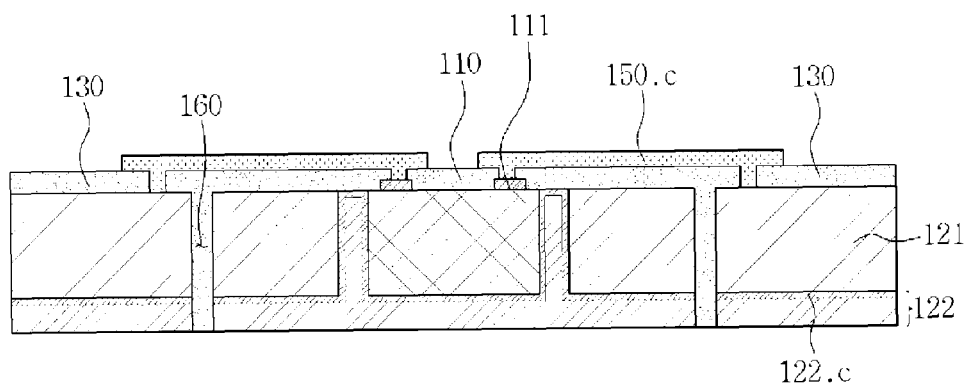
FIG. 21 is a cross-sectional view taken along a line A-A' of FIG. 19.

Next, as illustrated in FIGS. 19 to 21, at the electrode pattern formation step S24.c, the electrode pattern 150 that electrically connects the electrode pad 111 of the semiconductor chip 110 to the electrode portion 120.b is formed.

The third electrode pattern 150.c is formed such that a first end thereof is electrically connected to the electrode pad 111 of the semiconductor chip 110 through the first via hole 140.a and a second end thereof is electrically connected to a portion of the second base substrate 121.b of the electrode portion 120.b through the third via hole 140.c. The third electrode pattern 150.c can be formed by depositing a metal layer and performing existing semiconductor manufacturing processes such as photolithography and dry or wet etching on the metal layer.

Since the electrode pad 111 of the semiconductor chip 110 is connected to the electrode portion 120.b through the third electrode pattern 150.c, it is possible to provide an MLF-type semiconductor package in which an input or output signal of the semiconductor chip 110 is transmitted to and received from an external circuit through the electrode portion 120.b.

Figure 22:
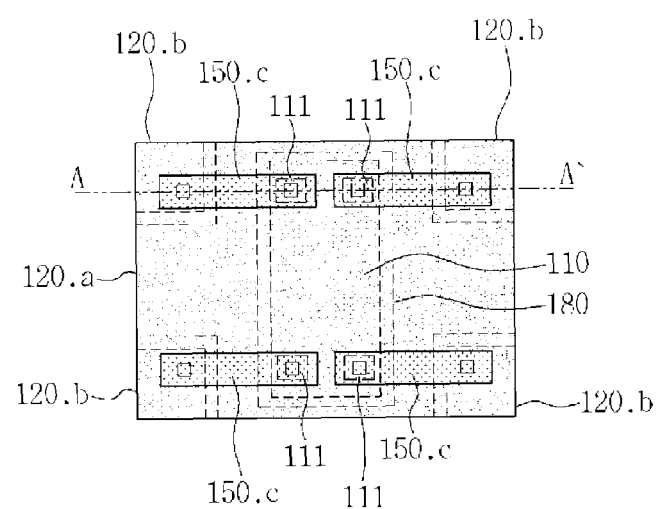
FIG. 22 is a plan view illustrating a fifth process in the method for manufacturing the semiconductor package according to the second embodiment of the present invention.
Figure 23:
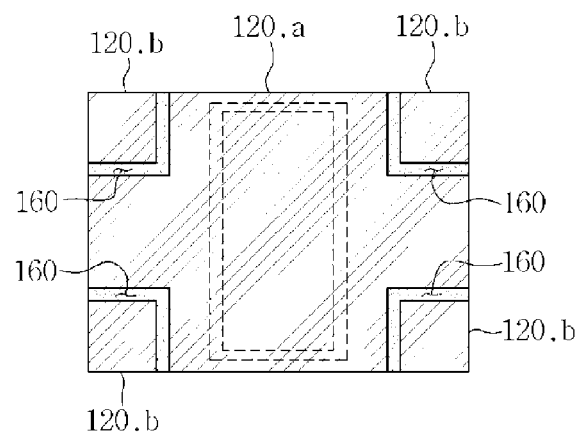
FIG. 23 is a bottom view of the structure of FIG. 22.
Figure 24:
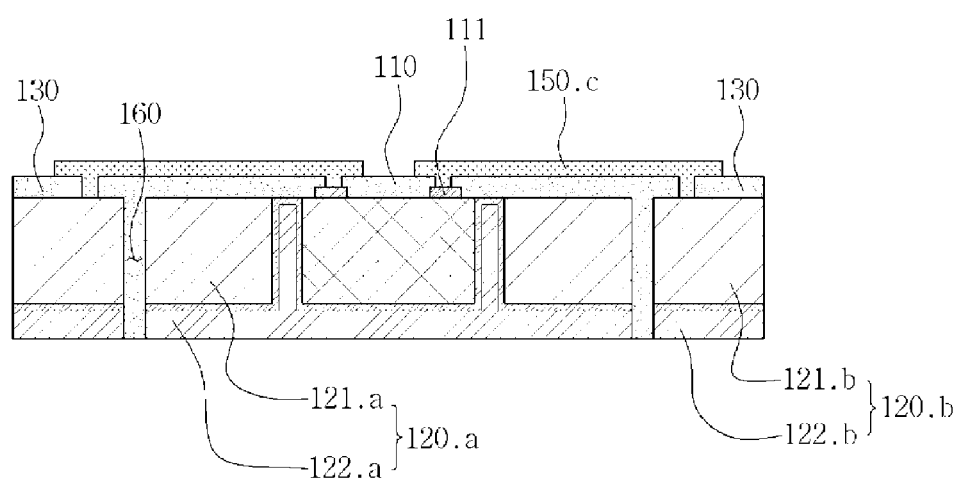
FIG. 24 is a cross-sectional view taken along a line A-A' of FIG. 22.

Next, as illustrated in FIGS. 22 to 24, at the dicing step S24.d, the stacked structure of the base substrate 121 and the heat dissipating member 122 undergoes a dicing process in which the stacked structure of the base substrate 121 and the heat dissipating member 122 is cut along dicing lines that respectively extends near the first and second ends TE1 and TE2 of the trench 160. As a result, the ground portion 120.a and the electrode portion 120.b are electrically insulated from each other.

For example, FIG. 19 illustrates dicing lines 1-1', 2-2', 3-3' and 4-4'. Along these dicing lines, the stacked structure of the base substrate 121 and the heat dissipating member 122 is cut. The dicing lines cross the first portion and the second portion of the trench 160 at positions near the first end TE1 and the second end TE2. The dicing lines are drawn such that the ground portion 120.a and the electrode portion 120.b can be electrically insulated from each other by the trench 160.

Specifically, as illustrated in an enlarged view of FIG. 19, the dicing lines 2-2' and 3-3' may cross the trench 160 at positions near the first and second ends TE1 and TE2 that are located at sides of the semiconductor chip 110. The form and position of the dicing lines can be differently set according to the shape and position of the trench 160. The dicing lines may be straight lines or curved lines.

When forming a plurality of semiconductor packages at the same time, as illustrated in FIG. 25, each of the dicing lines may cross a plurality of trenches 160 to simplify the dicing process. The cutting of the stacked structure of the base substrate 121 and the heat dissipating member 122 can be performed using a blade dicing method, a laser dicing method, or a pattern mask formation and etching method.

When the stacked structure of the base substrate 121 and the heat dissipating member 122 is cut along the dicing lines, as illustrated in FIGS. 22 to 24, the first and second ends TE1 and TE2 of the trench 160 are respectively flush with two side surfaces of the stacked structure of the base substrate 121 and the heat dissipating member 122, so that the ground portion 120.a and the electrode portion 120.b can be electrically insulated from each other.

Although not illustrated, back-grinding, chemical-mechanical polishing (CMP), film-thinning, and stacking can be further performed.

Although preferred embodiments of the present invention have been described for illustrative purposes, a semiconductor package and a method for manufacturing the same according to the present invention are not limited to the preferred embodiments, and those skilled in the art will appreciate that various modifications, alterations, changes, additions, and substitutions are possible, without departing from the scope and spirit of the invention as disclosed in the accompanying claims.

Therefore, simple changes and modifications may fall within the scope of the present invention, and the specific protection scope of the present invention will be clearly defined by the accompanying claims.

What is claimed is:
1. A semiconductor package comprising:
a base substrate provided with at least one cavity and made of a metallic material;
at least one semiconductor chip mounted in the cavity;
a heat dissipating member arranged in a gap between an inner surface of the cavity and the semiconductor chip, wherein the heat dissipating member covers a back surface and side surfaces of the semiconductor chip, and covers a back surface of the base substrate; and
at least one trench extending through the base substrate and the heat dissipating member in a thickness direction thereof, thereby dividing the base substrate and the heat dissipating member into a ground portion and an electrode portion and electrically insulating the ground portion and the electrode portion from each other.

2. The semiconductor package according to claim 1, further comprising at least one electrode pattern formed on a front surface of the base substrate and electrically connected to the base substrate.

3. The semiconductor package according to claim 1, wherein the ground portion includes a first base substrate within which the semiconductor chip is mounted and a first heat dissipating member covering the back surface of the first base substrate, and wherein the electrode portion includes a second base substrate electrically insulated from the first base substrate and a heat dissipating member covering the back surface of the second base substrate.

4. The semiconductor package according to claim 3, wherein the trench includes a first portion extending in a first direction of a surface of the base substrate and having a predetermined length and a second portion extending from an end of the first portion in a second direction different from the first direction and having a predetermined length.

5. The semiconductor package according to claim 4, wherein the electrode portion is formed near an edge of the base substrate and wherein the electrode portion and an electrode pad of the semiconductor chip are formed in one-on-one correspondence.

6. The semiconductor package according to claim 5, wherein the trench is formed such that the first portion extends in a widthwise direction of the base substrate and having the predetermined length and the second portion extends from the end of the first portion in a lengthwise direction of the base substrate and having the predetermined length, separating the electrode portion from the ground portion by a predetermined distance.

7. A method for manufacturing a semiconductor package, the method comprising:
    forming at least one cavity in a base substrate made of a metallic material;
    mounting a semiconductor chip in the cavity;
    forming a heat dissipating member to fill a gap between an inner surface of the cavity and the semiconductor chip and to cover a back surface of the base substrate; and
    dividing the base substrate and the heat dissipating member into a ground portion within which the semiconductor is mounted and an electrode portion electrically insulated from and located on one side of the ground portion.

8. The method according to claim 7, further comprising:
    forming an insulation layer on a front surface of the base substrate after the forming of the heat dissipating member; and
    forming an electrode pattern electrically connected to the semiconductor chip and an electrode pattern electrically connected to a portion of the base substrate, on the insulation layer.

9. The method according to claim 7, wherein the dividing of the base substrate and the heat dissipating member includes:
    forming at least one trench at a boundary portion between the ground portion and the electrode portion, thereby separating the ground portion from the electrode portion by a predetermined distance, the trench extending through the base substrate and the heat dissipating member in a thickness direction and being elongated in a longitudinal direction and a widthwise direction of the base substrate when shown in a plan view of the base substrate;
    filling the trench with an insulation material and forming an insulation layer on the front surface of the base substrate;
    forming an electrode pattern that electrically connects an electrode pad of the semiconductor chip to the electrode portion; and
    cutting the base substrate and the heat dissipating member along dicing lines extending at positions near respective ends of the trench, thereby electrically insulating the ground portion and the electrode portion from each other.

* * * * *

UNITED STATES PATENT AND TRADEMARK OFFICE
CERTIFICATE OF CORRECTION

PATENT NO. : 9,984,950 B2
APPLICATION NO. : 15/441188
DATED : May 29, 2018
INVENTOR(S) : Jun Chul Kim et al.

Page 1 of 1

It is certified that error appears in the above-identified patent and that said Letters Patent is hereby corrected as shown below:

On the Title Page

Item (72) "Inventors:" should read:
Jun Chul Kim, Seongnam-si (KR);
Dong Su Kim, Seongnam-si (KR);
Jong Min Yook, Seongnam-si (KR)

Signed and Sealed this
Thirty-first Day of July, 2018

Andrei Iancu
*Director of the United States Patent and Trademark Office*